United States Patent [19]

Wakamiya et al.

[11] Patent Number: 5,459,344
[45] Date of Patent: Oct. 17, 1995

[54] STACKED CAPACITOR TYPE SEMICONDUCTOR MEMORY DEVICE AND MANUFACTURING METHOD THEREOF

[75] Inventors: Wataru Wakamiya; Yoshinori Tanaka; Takahisa Eimori; Hiroji Ozaki; Hiroshi Kimura; Shinichi Satoh, all of Hyogo, Japan

[73] Assignee: Mitsubishi Denki Kabushiki Kaisha, Tokyo, Japan

[21] Appl. No.: 727,783

[22] Filed: Jul. 10, 1991

Related U.S. Application Data

[63] Continuation of Ser. No. 364,033, Jun. 9, 1989, Pat. No. 5,047,817.

[30] Foreign Application Priority Data

Jun. 10, 1988 [JP] Japan ................................ 63-144311
Mar. 30, 1989 [JP] Japan .................................... 1-83171

[51] Int. Cl.$^6$ ........................ H01L 29/68; H01L 29/78; H01L 27/02
[52] U.S. Cl. ............................................ 257/307; 257/534
[58] Field of Search ............................. 357/23.6, 51

[56] References Cited

U.S. PATENT DOCUMENTS 4,151,607  4/1979  Koyanagi et al. .
4,742,018  5/1988  Kimura et al. .
4,953,126  8/1990  Ema ........................................ 365/182
4,958,318  9/1990  Harai ...................................... 365/149

FOREIGN PATENT DOCUMENTS

| | | | |
|---|---|---|---|
| 0223616 | 11/1986 | European Pat. Off. | 357/23.6 |
| 0317199 | 11/1987 | European Pat. Off. | 357/23.6 |
| 0295709 | 6/1988 | European Pat. Off. | 357/23.6 |
| 0295709 | 7/1988 | European Pat. Off. . | |
| 0317199 | 11/1988 | European Pat. Off. . | |
| 3842474 | 12/1988 | Germany | 357/23.6 |
| 3922467 | 3/1989 | Germany . | |
| 60-2784 | 1/1985 | Japan | 357/23.6 |
| 61-130941 | 12/1987 | Japan | 357/23.6 |

*Primary Examiner*—Andrew J. James
*Attorney, Agent, or Firm*—Lowe, Price, LeBlanc & Becker

[57] ABSTRACT

A semiconductor memory device according to the present invention comprises a memory cell having one transistor and one stacked capacitor. The stacked capacitor is stacked on the surface of a semiconductor substrate. Further, the stacked capacitor has a structure extending on a gate electrode and a word line through an insulating layer. A lower electrode layer of the capacitor has various concave/convex shapes, i.e. step portions and projecting portions formed on the surface thereof. These shapes are made by employing various etching processes. The lower electrode layer has such various concave/convex shapes formed thereon, so that a surface area and capacitance of the capacitor can be increased.

5 Claims, 19 Drawing Sheets

STACKED CAPACITOR TYPE SEMICONDUCTOR MEMORY DEVICE AND MANUFACTURING METHOD THEREOF

This application is a continuation of application Ser. No. 07/364,033, filed Jun. 9, 1989, now U.S. Pat. No. 5,047,817.

BACKGROUND OF THE INVENTION

1. Field of the Invention

The present invention relates to a semiconductor memory device having stacked capacitors, and more particularly to improvements in the configuration of a stacked capacitor capable of increasing capacitance of the capacitor, and a manufacturing method thereof.

2. Description of the Background Art

Recently, semiconductor memory devices are in great demand as information processing apparatuses such as computers have come to be widely used. Semiconductor memory devices having large memory capacitances and capable of high speed operation are desired. Accordingly, the technology in association with the higher degree of integration, the high speed responsiveness and higher reliability of the semiconductor memory devices has been developed.

A DRAM (Dynamic Random Access Memory) is a semiconductor memory device capable of inputting/outputting memory data at random. Generally, a DRAM comprises a memory cell array which is a memory region storing a large number of data and peripheral circuits required for external input/output.

FIG. 16 is a block diagram showing a structure of a common DRAM. Referring to the figure, the DRAM 50 comprises a memory cell array 51 for storing data signals representing memory information, a row and column address buffer 52 for externally receiving an address signal for selecting a memory cell constituting a unit memory circuit, a row decoder 53 and a column decoder 54 for designating the memory cell by interpreting the address signal, a sense refresh amplifier 55 for amplifying the signals stored in the designated memory cell to read the same, a data in buffer 56 and a data out buffer 57 for data input/output, and a clock generator 58 for generating clock signals.

The memory cell array 51 occupying a large area on a semiconductor chip is constituted by an arrangement of a plurality of memory cells each storing unit memory data. FIG. 17 is an equivalent circuit diagram of 4 bits of memory cells constituting the memory cell array 51. The shown memory cell is a 1-transistor 1-capacitor type memory cell comprising one MOS (Metal Oxide Semiconductor) transistor and one capacitor element connected thereto. The memory cell structure of this type is simple and it enables improvement of the degree of integration of the memory cell array, so that the structure is widely used for DRAMs having large capacitances.

FIG. 18 is a plan view of the structure of the memory cell array. This figure corresponds to an equivalent circuit diagram of FIG. 17. The memory cell array comprises a plurality of word lines 27, 27 extending in a row direction, and a plurality of bit lines 42, 42 extending in a column direction. A memory cell 45 is formed in the vicinity of an intersecting portion of a word line 27 and a bit line 42.

FIG. 19 is a cross sectional view of the memory cell 45 taken along the line A-A of FIG. 18. The memory cell 45 comprises one access transistor 21 and one capacitor 22. The access transistor 21 comprises a gate electrode 4 formed on a main surface of a semiconductor substrate 1 through a gate insulating film 5a, and a pair of source and drain regions 6, 6 formed on the surface of the semiconductor substrate 1. The gate electrode 4 is constituted by a part of the word line 27.

That capacitor 22 comprises a lower electrode (a storage node) 7, a dielectric film 8 and an upper electrode (a cell plate) 9. A part of the lower electrode 7 is connected respectively to opposite sides of the source and drain regions 6, 6 of the access transistor 21. One end of the lower electrode 7 extends over the gate electrode 4 through an insulating film 5b. The other end of the lower electrode 7 extends on the word line 27 formed over a field oxide film 3 through the insulating film 5b.

The capacitor in which the dielectric film 8 is formed on the lower electrode 7 stacked on the surface of the semiconductor substrate 1 is called a stacked capacitor.

As described in the beginning, a memory cell structure of the DRAM is miniaturized for high integration. Accordingly, a plane area occupied by the capacitor is also reduced. A capacitance of the capacitor need to retain more than a prescribed capacitance. The capacitance of the capacitor is in proportion to the area where the dielectric film 8, the lower electrode 7 and the upper electrode 9 face one another. In the stacked capacitor 22 shown in FIG. 19, a surface region P and a side region S of the lower electrode 7 constitute a capacitance portion.

Next, a manufacturing method of the memory cell of the DRAM shown in FIG. 19 will be described. FIGS. 20A–20D are cross sectional views illustrating the manufacturing steps of the memory cell.

As shown in FIG. 20A, the field oxide film 3 consisting of an oxide film is formed on the surface of the semiconductor substrate 1. A region enclosed by the filed oxide film 3 constitutes an element forming region 2.

In FIG. 20B, a conductive film of polycrystalline silicon and the insulating film 5b of an oxide film are deposited on the gate insulating film 5a formed on the surface of the semiconductor substrate 1 and selectively etched. Accordingly, the gate electrodes 4a, 4b are formed in prescribed positions, respectively. The insulating film 5b of an oxide film is then deposited. Further, the oxide film is etched to expose the surface region 2 other than the gate electrode 4a. At the same time, the insulating film 5b is left in a self aligning manner on sidewall portions of the gate electrodes 4a, 4b. The top surface portions and the side portions of the gate electrodes 4a, 4b are covered with the insulating film 5b. Moreover, impurities are injected by an ion implantation method into the surrounding surface region 2 of the gate electrode 4a so as to form an impurity diffusion layer 6 of a conductivity type opposite to that of the substrate 1.

In FIG. 20C, a conductive film 7 of polycrystalline silicon is formed which extends over the gate electrode 4a to the gate electrode 4b on the field oxide film 3 through the diffusion layer 6.

In FIG. 20D, the dielectric layer 8 formed of a multi-layer film of an oxide film and a nitride film, and the conductive film 9 of polycrystalline silicon are deposited. The capacitor 22 is formed by the manufacturing steps described above.

Generally, if an area occupied by a storage element is 1/k due to an increase in the degree of integration, a surface area of the conductive film 7 is also reduced to 1/k. However, even if the surface area is 1/k, a length around the surface is only $1/=\overline{k}$. Therefore, a side area of the conductive film 7 is only reduced to $1/=\overline{k}$ as well if a thickness of the film is the same, so that a contribution rate of the side portion of the conductive film 7 to storage capacitance increases as the degree of integration increases. If the conductive film 7 is made thicker in order to increase the area of the side portion, the following phenomenon occurs.

The conductive film 7 is formed lying over high step portions formed by the gate electrode 4 and the like. Therefore, if the film is thick, an unnecessary portion of the conductive film 7 is liable to remain unremoved in a region 10 of the bottom portion of the steps in the process for patterning the film in a prescribed shape. This etching residue 17 is liable to occur in such places as shown in FIG. 18, and hence there is a problem that a short circuit to an adjacent pattern is liable to occur.

Furthermore, as shown in FIG. 21, if the conductive film 7 is thickly formed, the side area thereof increases, whereas the surface area decreases because the surface is smoothed. Accordingly, there is a problem that the capacitance of the capacitor decreases.

SUMMARY OF THE INVENTION

It is an object of the present invention to provide a structure of a capacitor capable of increasing charge storing capacitance.

It is another object of the present invention to increase an area where an electrode layer and a dielectric layer of the capacitor are facing each other.

It is a further object of the present invention to increase the charge storing capacitance of a semiconductor memory device having a stacked capacitor.

It is a still further object of the present invention to provide a manufacturing method of the semiconductor memory device having a stacked capacitor of an increased charge storing capacitance.

The semiconductor memory device according to the present invention comprises a capacitor of an increased area between two electrode layers and a dielectric layer interposed between these two electrode layers. In the capacitor stacked on a main surface of a semiconductor substrate, a first electrode layer positioned in a lower part is formed to have a surface of various shapes. The shape of the surface is selected so as to increase its surface area contacting with the dielectric layer. As an example, step portions and projecting portions projecting in an almost vertical direction are formed on the surface of the first electrode layer. The surface of such a shape enlarges a charge storing region of the capacitor without increasing a plane area of the capacitor occupied on the surface of the semiconductor substrate.

Another aspect of the present invention is to illustrate a manufacturing method of the semiconductor memory device having a stacked capacitor. The first electrode layer of the capacitor is patterned in a shape lying on a gate electrode and an interconnection layer extending over an element isolating region through an insulating layer. Further, the first electrode layer is formed to have a surface of a prescribed shape. For example, in the first example, after a step is formed on the insulating layer, the first electrode layer is formed on the step portion thereof. In the second example, after the insulating layer is partially etched to form a step concave portion, the first electrode layer is formed on the step concave portion. In the third example, after the first electrode layer is formed on the insulating layer, the insulating layer is etched by isotropic etching to form a space beneath the end portion of the first electrode layer. In the fourth example, the surface of the first electrode layer is selectively etched away to form concave/convex on the surface. In the fifth example, by employing twice a conductive layer forming process for the first electrode layer, the projecting portion is formed extending in a vertical direction on the surface of the first electrode layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
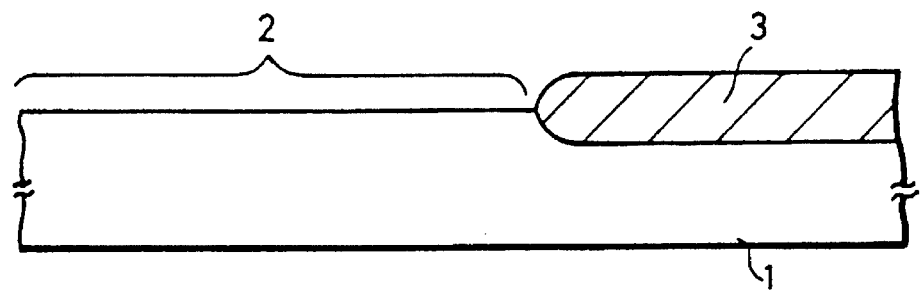
FIGS. 1A–1H are cross sectional views illustrating manufacturing steps of a semiconductor device according to the first embodiment of the present invention.

A memory cell structure of a DRAM comprising a stacked capacitor according to the first embodiment of the present invention will now be described with reference to FIG. 1H.

The memory cell of the DRAM is formed of one access transistor 21 and one capacitor 22. The access transistor 21 comprises a pair of impurity diffusion regions 6, 6 formed on the surface of a semiconductor substrate 1, and a gate electrode 4a formed through a thin gate oxide film 5a. The gate electrode 4a is formed of a part of a word line 27.

The capacitor 22 is formed of a conductive film (a lower electrode) 7 made of a conductive material such as polycrystalline silicon, a dielectric layer 8 formed on the surface of this conductive film 7, and a conductive film (an upper electrode) 9 made of polycrystalline silicon.

Figure 2A:
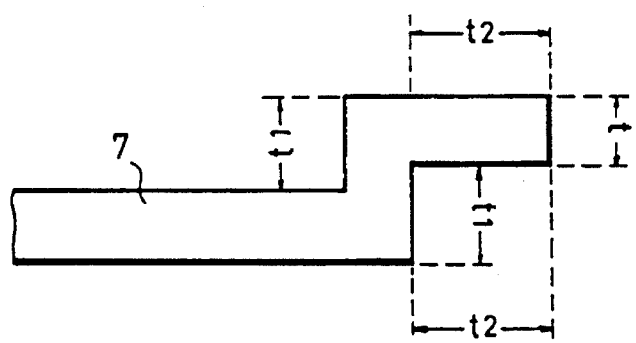
FIGS. 2A and 2B are cross sectional views illustrating a shape of the end portion of a conductive film of the semiconductor device shown in FIGS. 1A–1H.
Figure 2B:

A part of the conductive film 7 is connected to one impurity diffusion region 6 of the access transistor 21. Further, the conductive film 7 extends over the gate electrode 4a to the word line 27 running across a field isolating oxide film 3. The end portions of the conductive film 7 extend on the gate electrodes 4a and the word line 27 through an insulating film 5b. Also, each of the end portions of the conductive film 7 has a step portion rising upward. A surface area of the conductive film 7 is increased by this step portion. Assuming that the thickness of the semiconductor film 7 is t, the thickness of the step portion $t_1$, and the lengths of the step portion $t_2$, the surface area of the conductive film 7 shown in FIG. 2A is larger than that of the conventional conductive film 7 shown in FIG. 2B by the surface area corresponding to the thickness $(t+2t_1+t_2)$. As described above, charge storing capacitance of the capacitor increases by forming the step portion on the end portion of the conductive film 7.

As shown in FIG. 1A, a surface region 2 enclosed by an insulating film 3 for element isolation made of an oxide film, for example, is formed on a semiconductor substrate 1.

Figure 1B:
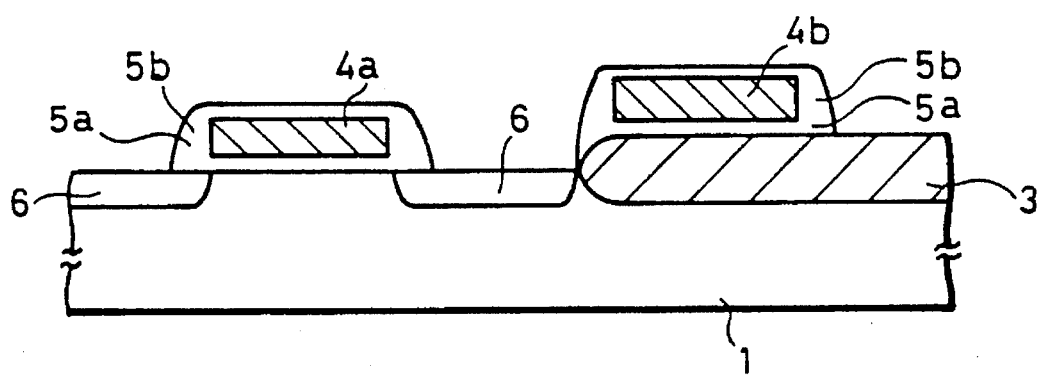

As shown in FIG. 1B, gate electrodes 4a, 4b are formed on a gate insulating film 5a formed on the surface of a semiconductor substrate 1, and the upper side portions thereof are coated with an insulating film 5b. Further, a pair of impurity diffusion layers 6b is formed on the surface region 2 surrounding the gate electrode 4a.

Figure 1C:
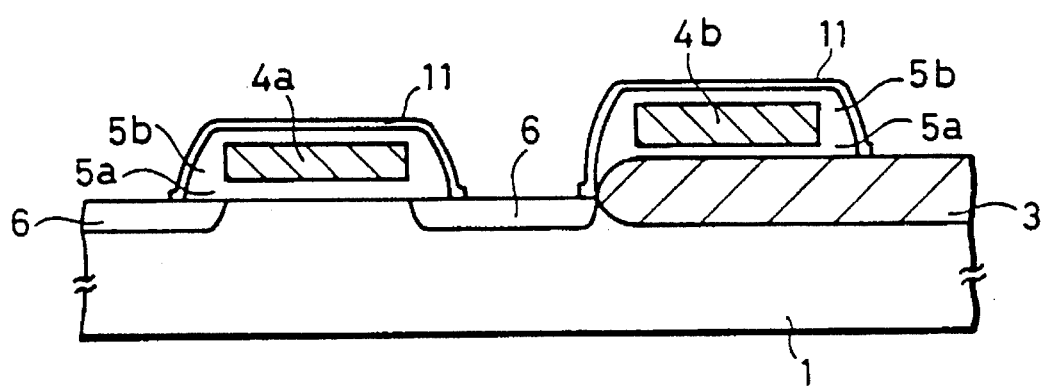

In FIG. 1C, a silicon nitride film 11, for example, is deposited, and thereafter an unnecessary portion thereof is removed, so that the nitride film 11 is patterned to completely coat the insulating films of the top surface portions and the side portions of the gate electrodes 4a, 4b and expose large portions of the surfaces of the impurity diffusion layers 6.

Figure 1D:
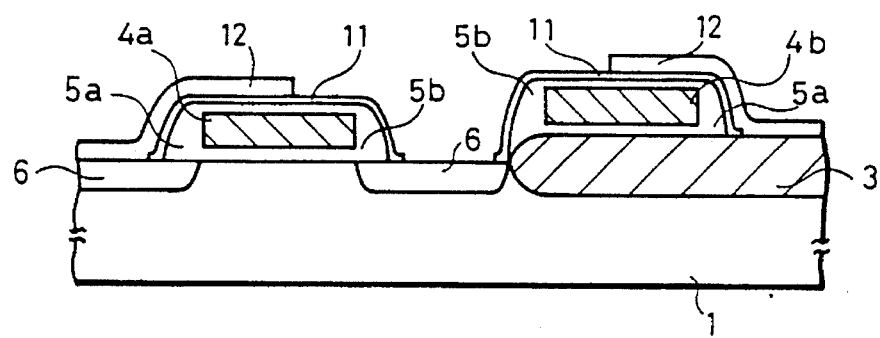

In FIG. 1D, a silicon oxide film 12 is deposited and then patterned so that the end portions thereof extend beneath a conductive film 7 formed later.

Figure 1E:
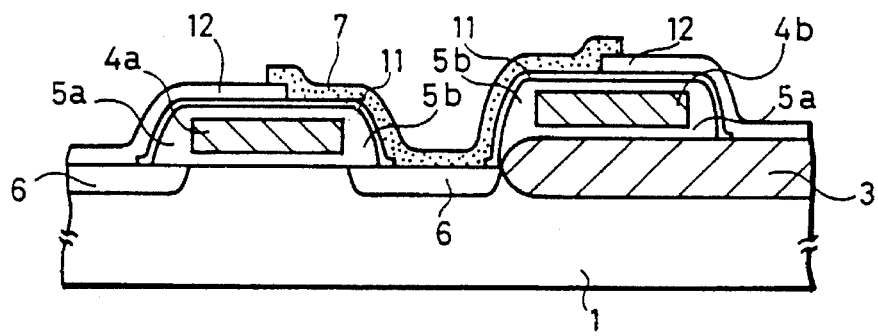

As shown in FIG. 1E, a conductive film 7 made of polycrystalline silicon is deposited and a portion thereof is superimposed on the oxide films 12 to form a pattern extending between the oxide films 12, 12.

Figure 1F:
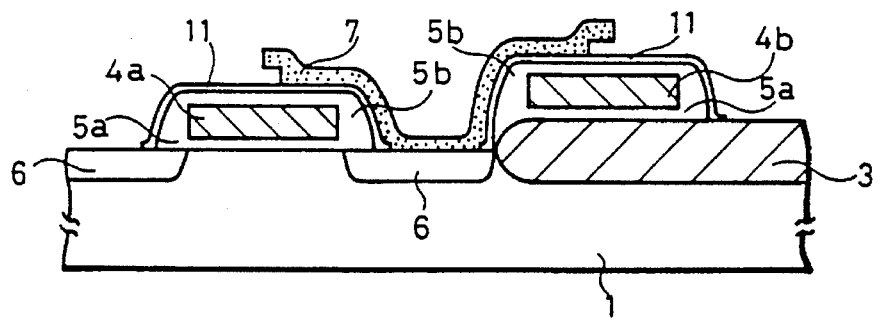

In FIG. 1F, the oxide film 12 is removed by an oxide film removing liquid in which hydrofluoric acid and ammonium fluoride, for example, are mixed in an appropriate proportion. In the steps of removing the oxide film, the nitride film 11 prevents the insulating film 5b from being etched away at the same time.

Figure 1G:
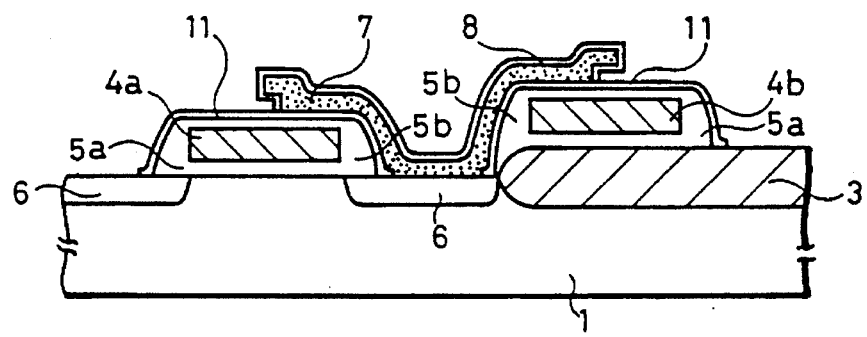

In FIG. 1G, a dielectric layer 8 is uniformly deposited on the exposed surface of the conductive film 7 by a low pressure CVD method, for example.

Figure 1H:
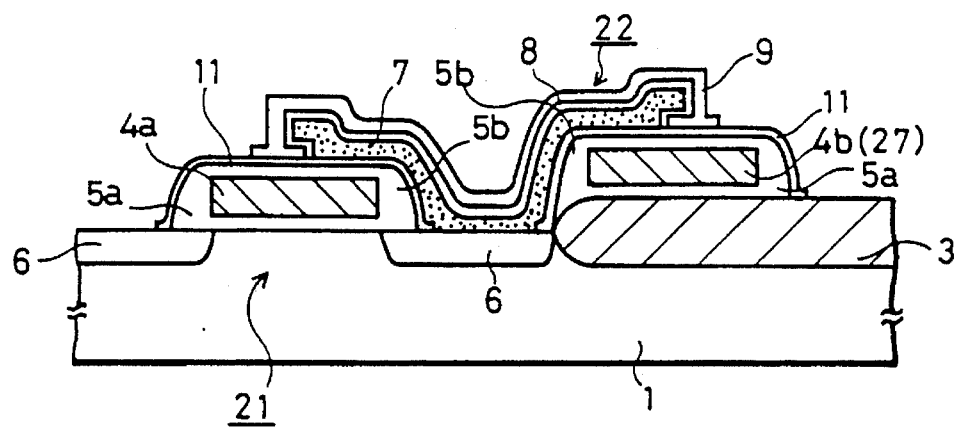

Referring to FIG. 1H, a conductive film 9 is deposited by the low pressure CVD method to completely coat the conductive film 7. Finally, the structure shown in the figure is provided.

FIGS. 3A–3E are cross sectional views illustrating the steps of a manufacturing method of the memory cell of the DRAM according to the second embodiment of the present invention.

Figure 3A:
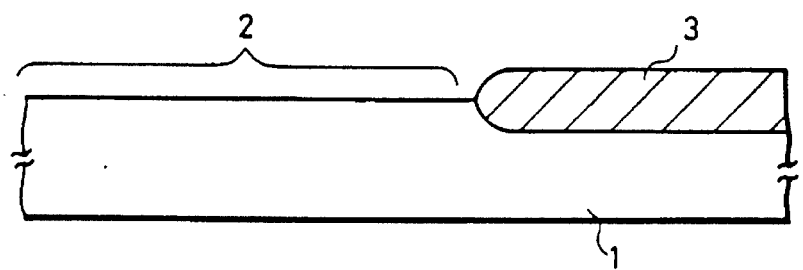
FIGS. 3A–3E are cross sectional views illustrating manufacturing steps of the semiconductor device according to the second embodiment of the present invention.
Figure 3B:
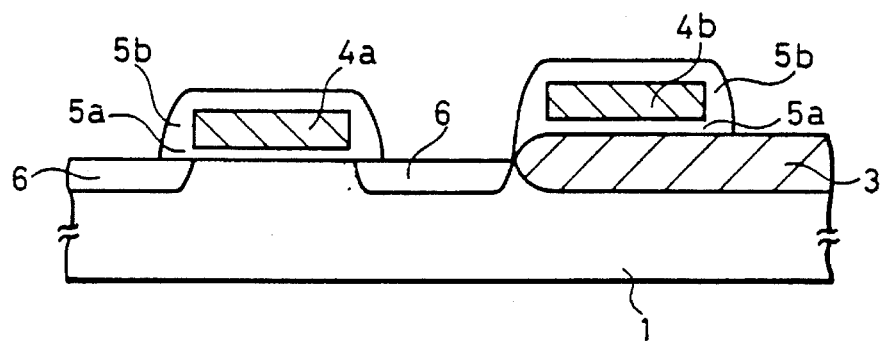

The steps shown in FIGS. 3A, 3B are the same as those shown in FIGS. 1A, 1B.

Figure 3C:
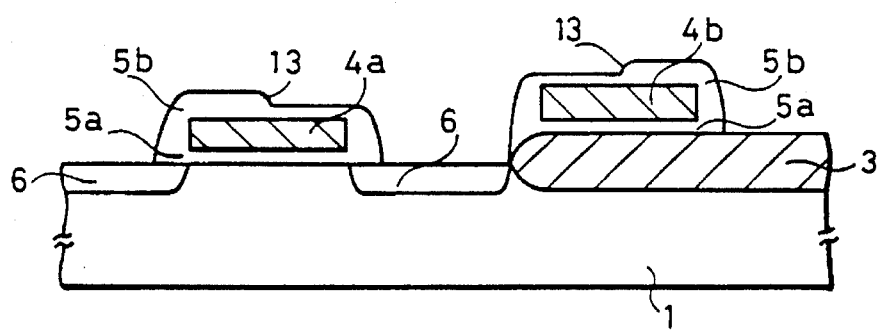

In FIG. 3C, the top surface of the insulating film 5b is etched to form a step 13 with a photoresist (not illustrated) and the like used as masks.

Figure 3D:
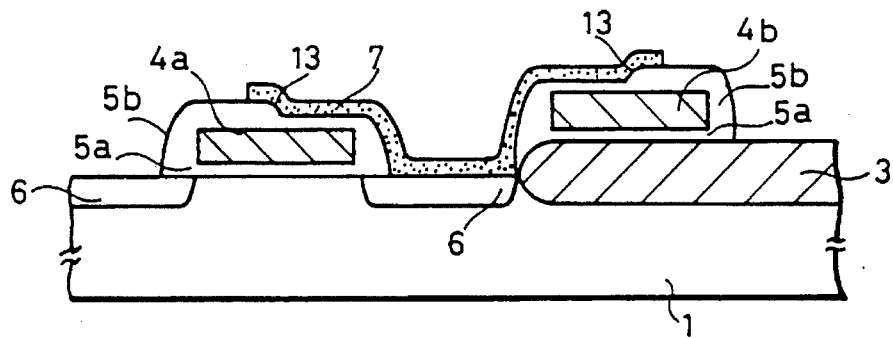

In FIG. 3D, the conductive film 7 is formed to extend on the step 13.

Figure 3E:
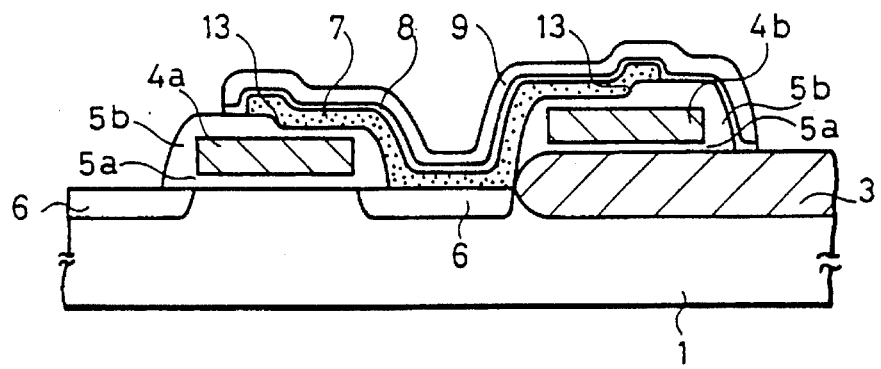

As shown in FIG. 3E, the dielectric layer 8 and the conductive film 9 are stacked in turn on the conductive film 7.

Also in the above structure, an effective surface area of the conductive film 7 increases according to the step 13 formed on the top surface of the insulating film 5b, so that storage capacitance can be increased.

Figure 4:
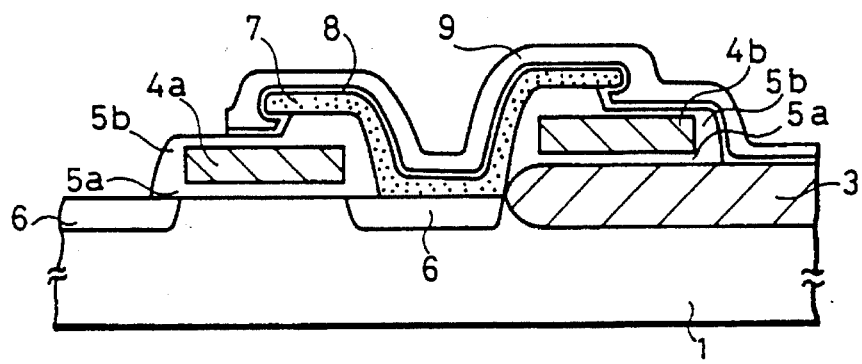
FIG. 4 is a cross sectional view of the semiconductor device according to the third embodiment of the present invention.

FIG. 4 is a cross sectional view of the memory cell of the DRAM according to the third embodiment of the present invention.

In this example, the top surface of the insulating film 5b is isotropically etched with the conductive film 7 used as a mask. A portion not covered with the conductive film 7 and the insulating film 5b immediately beneath the end of the conductive film 7 are etched, so that such a step as to expose a portion of the back surface of the conductive film 7 is formed. The dielectric layer 8 and the conductive film 9 are stacked in turn on the step portion formed, resulting in the structure shown in FIG. 4.

Also in the above structure, the effective surface area of the conductive film 7 increases according to the step formed on the top surface of the insulating film 5b, so that storage capacitance can be increased.

Figure 5:
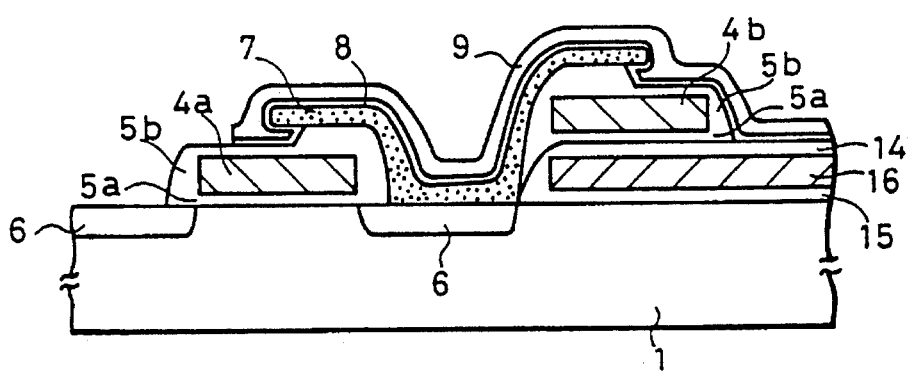
FIG. 5 is a cross sectional view of the semiconductor device according to the fourth embodiment of the present invention.

FIG. 5 is an example of a variation in the structure shown in FIG. 4 and illustrates the fourth embodiment of the present invention. FIG. 5 illustrates a cross sectional structure of the DRAM having a filed shield isolation structure, in place of a field isolating oxide film 3. The field shield structure comprises a conductive film 16 to which a fired potential for field shield isolating is applied, an insulating film 14 coating the upper portion and the sidewall portion thereof, and an insulating film 15 coating the lower portion thereof. Storage capacitance also increases in this example as well as in FIG. 4.

Figure 6:
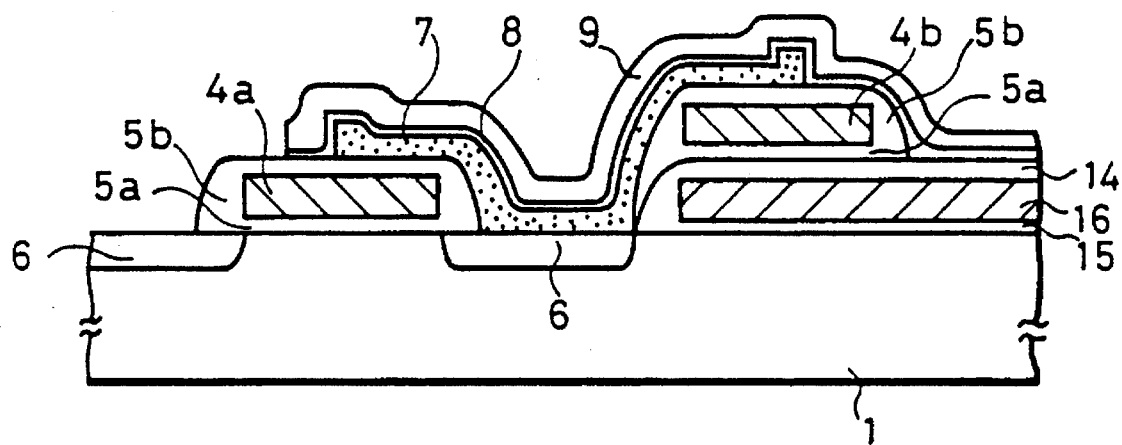
FIG. 6 is a cross sectional view of the semiconductor device according to the fifth embodiment of the present invention.

FIG. 6 is a cross sectional view of the memory cell of the DRAM illustrating the fifth embodiment of the present invention. The end portions of the conductive film 7 extending over the gate electrodes 4a, 4b are formed thicker than the other portions. The effective surface area of the conductive film 7 is increased due to the step of which the film is thickly formed, so that storage capacitance can be increased.

The above described field shield isolation structure is employed in this example.

Figure 7:
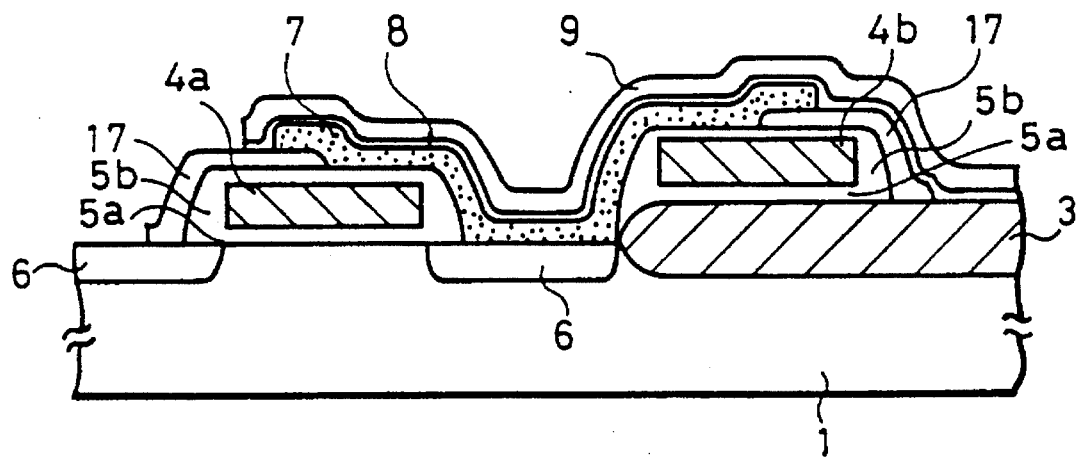
FIG. 7 is a cross sectional view of the semiconductor device according to the sixth embodiment of the present invention.

FIG. 7 is a cross sectional view of the memory cell of the DRAM illustrating the sixth embodiment of the present invention. In this example, such a structure is formed that an insulating film 17 is further formed on the insulating film 5b and a step is provided on the top surface of the insulating film 5b. Also in this case, the step is provided on the conductive film 7, and the surface area thereof increases.

Figure 8:
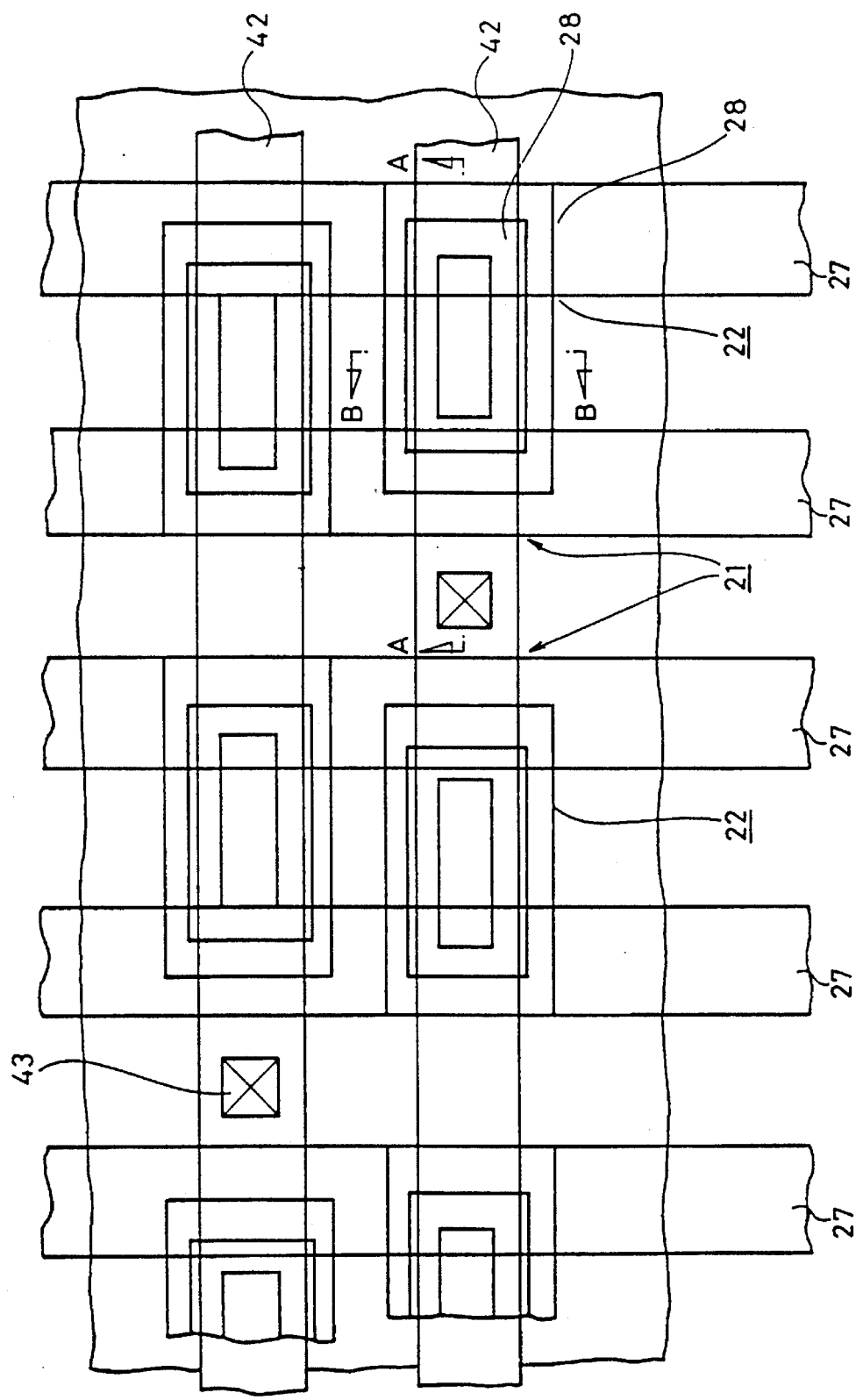
FIG. 8 is a plan view of a memory cell of a DRAM illustrating the seventh embodiment of the present invention.
Figure 9:
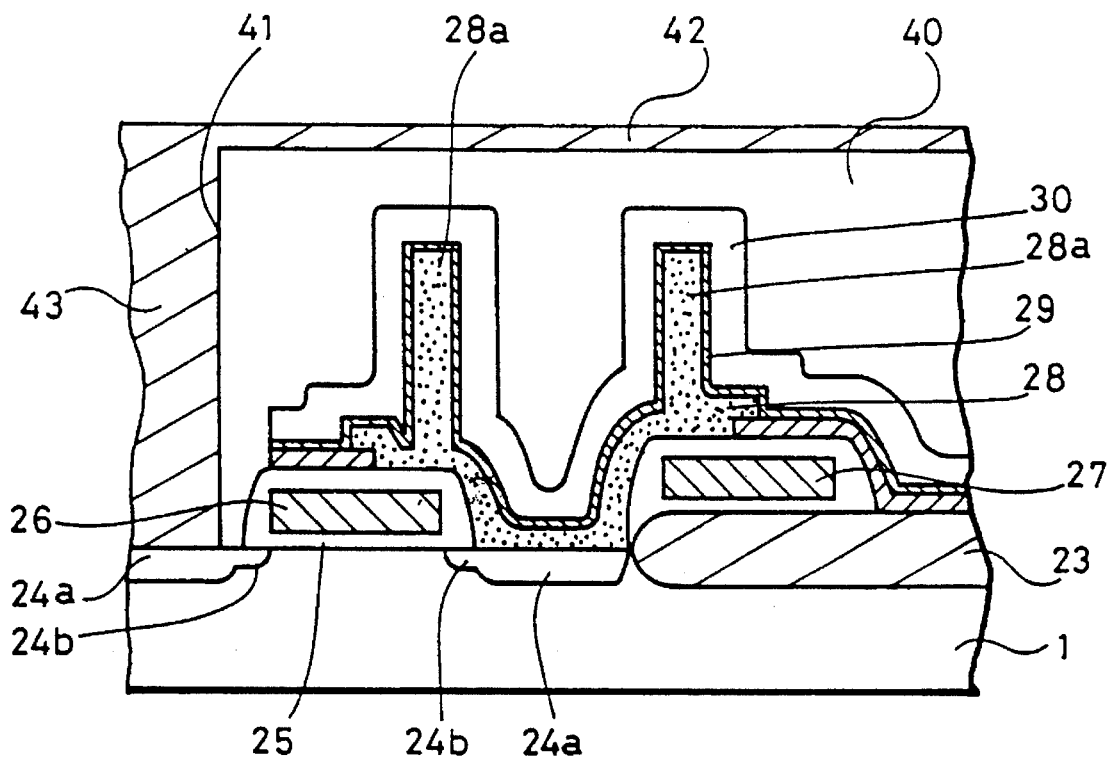
FIG. 9 is a cross sectional view taken along the line A—A in FIG. 8.
Figure 10:
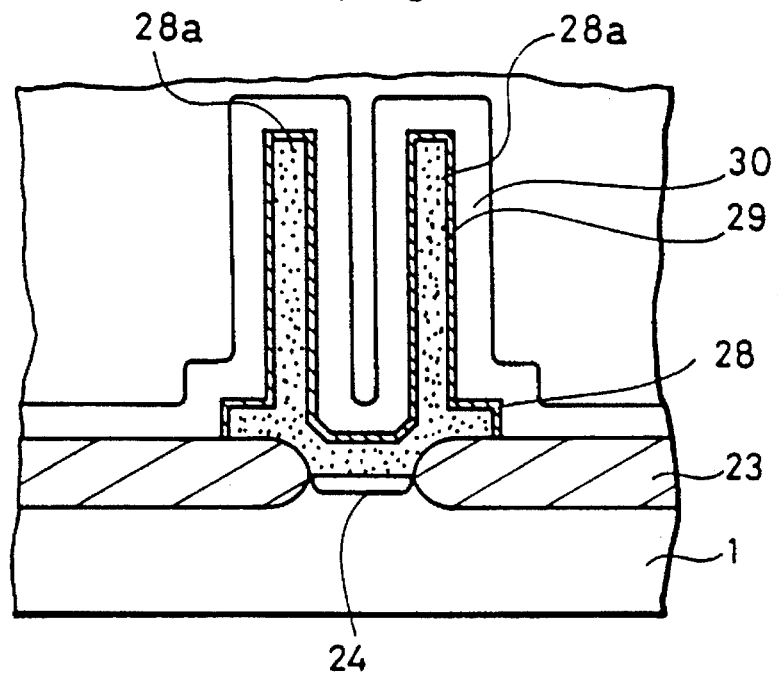
FIG. 10 is a cross sectional view taken along the line B—B in FIG. 8.

FIGS. 8–10 illustrate the structure of the semiconductor device according to the seventh embodiment of the present invention. FIG. 8 is a plan view of the structure of the memory cell of the DRAM; FIG. 9 is a cross sectional view taken along the line A—A in FIG. 8; and FIG. 10 is a cross sectional view taken along the line B—B in FIG. 8. Referring to these figures, a memory cell comprises one access transistor 21 and one capacitor 22. Each memory cell is insulated and isolated by a field isolation insulating film 23 selectively formed on the surface of the semiconductor substrate 1.

The access transistor 21 comprises a pair of impurity regions 24, 24 formed on the surface of the semiconductor substrate 1, and a gate electrode 26 formed through a thin gate oxide film 25. The impurity regions 24 are constituted by an impurity region 24a of relatively high concentration and another impurity region 24b of relatively low concentration, namely forming a LDD (Lightly Doped Drain) structure. Further, the gate electrode 26 is formed of one portion of a word line 27.

The capacitor 22 is constituted by a lower electrode 28 made of a conductive material such as polycrystalline silicon, a dielectric layer 29 formed on the surface of the lower electrode 28, and an upper electrode 30 made of polycrystalline silicon.

The lower electrode 28 has its portion connected to one impurity region 24 of the access transistor 21. Further, the lower electrode 28 extends over the gate electrode 25 to the top surface of the word line 27 running across the field isolating oxide film 23. In addition, a portion thereof has a rising wall portion 28a extending upward in a vertical direction. The rising wall portion 28a of this lower electrode 28 is formed to be positioned on the side portion of a hollow cuboid. The surface area of the lower electrode 28 is sharply increased by this rising wall portion 28a.

Manufacturing steps of the memory cell of the above described DRAM will now be described with reference to FIGS. 11A–11L.

Figure 11A:
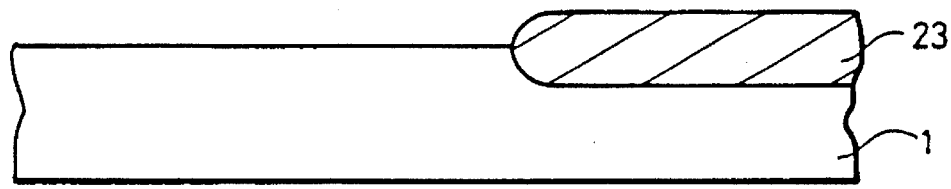
FIGS. 11A–11L are cross sectional views illustrating in turn the manufacturing steps of the memory cell of the DRAM shown in FIGS. 8–10.

First of all, in FIG. 11A, a thick field isolating oxide film 23 is formed on a prescribed region of the surface of the semiconductor substrate 1 by employing a LOCOS (Local Oxidation of Silicon) method.

Figure 11B:
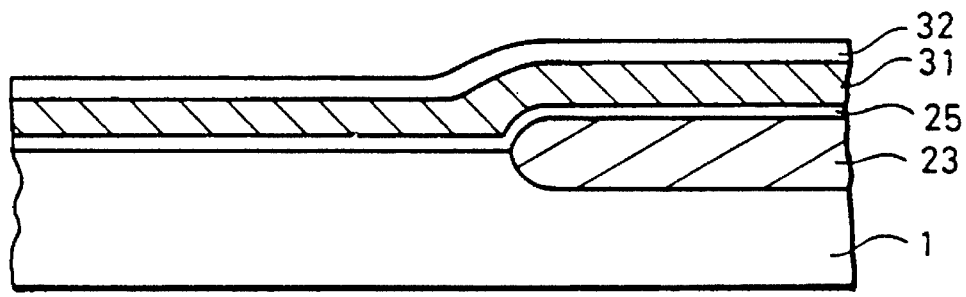

Next, in FIG. 11B, the surface of the semiconductor substrate 1 is processed by thermal oxidation to form an oxide film 25 on the surface of the semiconductor substrate surrounded by the field isolating oxide film 23. A polycrystalline silicon layer 31 doped with phosphorus is then formed by the low pressure CVD method. An insulating film 32 is then formed on the surface thereof by the low pressure CVD method.

Figure 11C:
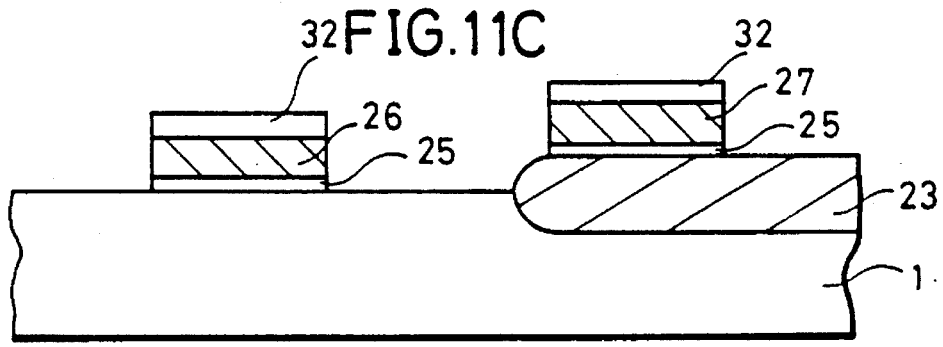

Further, in FIG. 11C, by employing a photolithography method and a dry etching method, the insulating film 32, the polycrystalline silicon layer 31 and the oxide film 25 are patterned in a prescribed shape. Accordingly, a gate oxide film 25, a gate electrode 26 and a word line 27 of the access transistor 21 are formed.

Figure 11D:
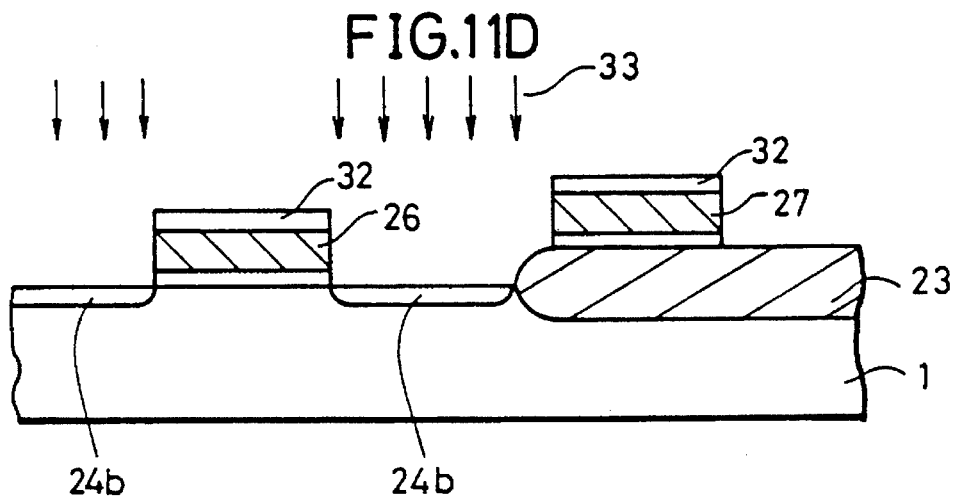

As shown in FIG. 11D, an impurity ion 33 is ion implanted to the surface of the semiconductor substrate 1 using the patterned gate electrode 26 and the like as masks. Impurity regions 24b, 24b of low concentration are formed in the semiconductor substrate 1.

Figure 11E:
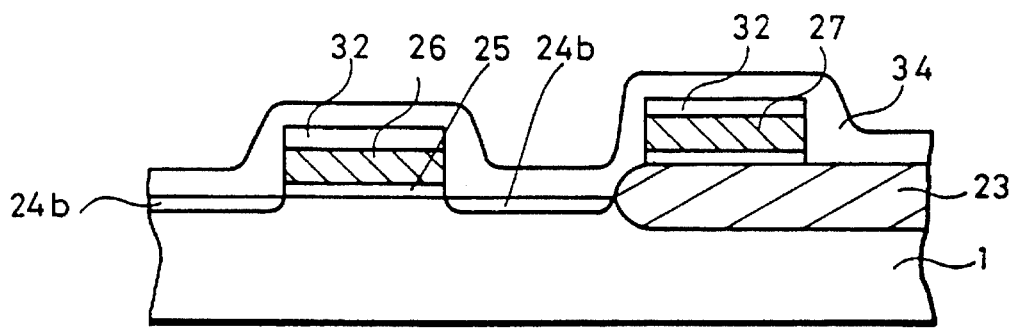

Further, in FIG. 11E, an insulating film 34 such as an oxide film is entirely deposited by employing the low pressure CVD method.

Figure 11F:
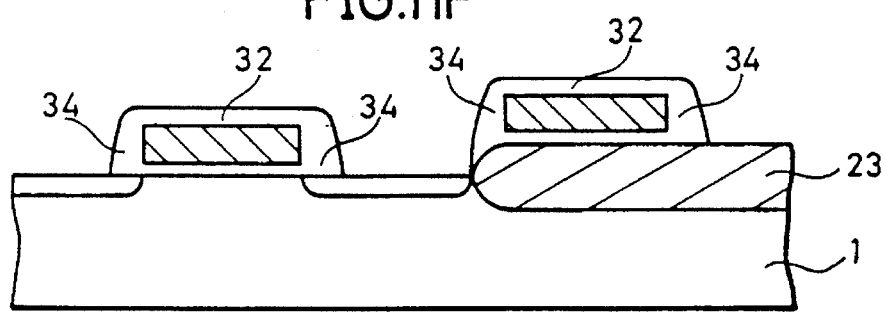

As shown in FIG. 11F, the insulating film 34 is selectively removed by anisotropical etching. Accordingly, the insulating films 32, 34 are left only on the top surfaces and the side surfaces of the gate electrode 26 and the word line 27.

Figure 11G:
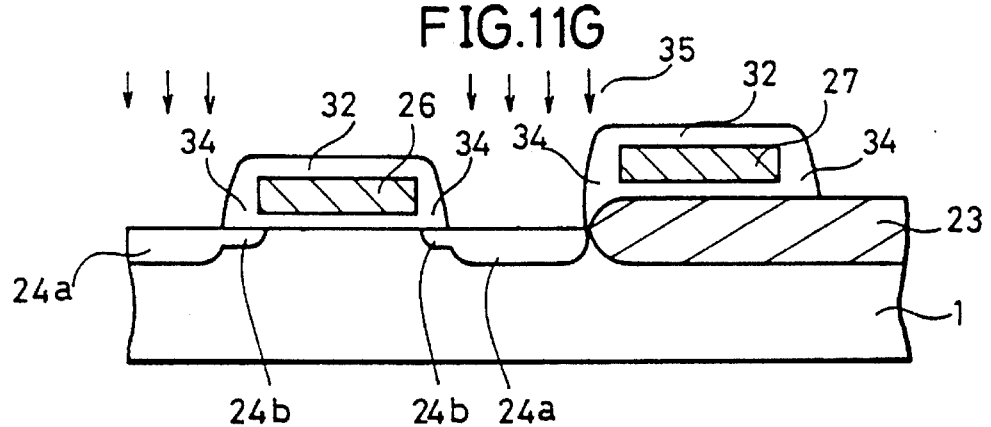

Thereafter, in FIG. 11G, an impurity ion 35 of high concentration is ion implanted in the surface of the semiconductor substrate 1, using the gate electrode 26 and the word line 27 covered with the insulating films 32, 34 as masks. Accordingly, an impurity region 24a of high concentration is formed on the surface of the semiconductor substrate 1, and at the same time the LDD structure is formed.

Figure 11H:
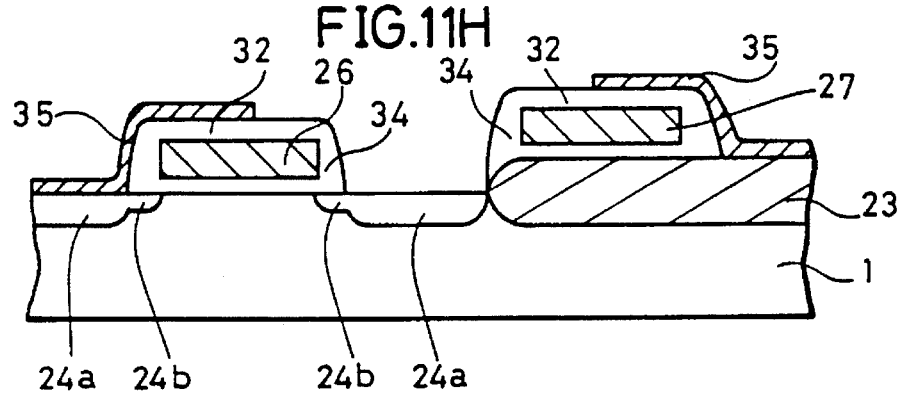

Next, in FIG. 11H, a nitride film 35 is deposited on the entire surface of the semiconductor substrate 1 by the low pressure CVD method. This nitride film 35 is then patterned in a prescribed shape.

Figure 11I:
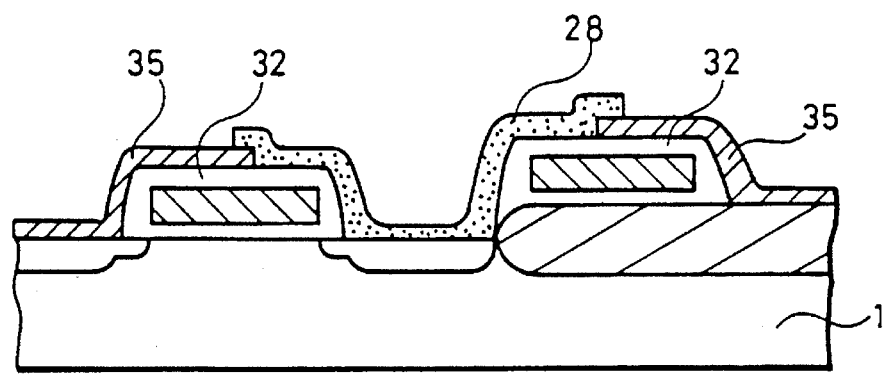

As shown in FIG. 11I, a polycrystalline silicon layer is deposited on the surfaces of the nitride film 35 and the like by employing the low pressure CVD method. This polycrystalline silicon layer is then patterned in a prescribed shape by the photolithography method and the etching method to form a lower electrode 28. Both end portions of the lower electrode 28 are respectively patterned to extend on the nitride film 35.

Figure 11J:
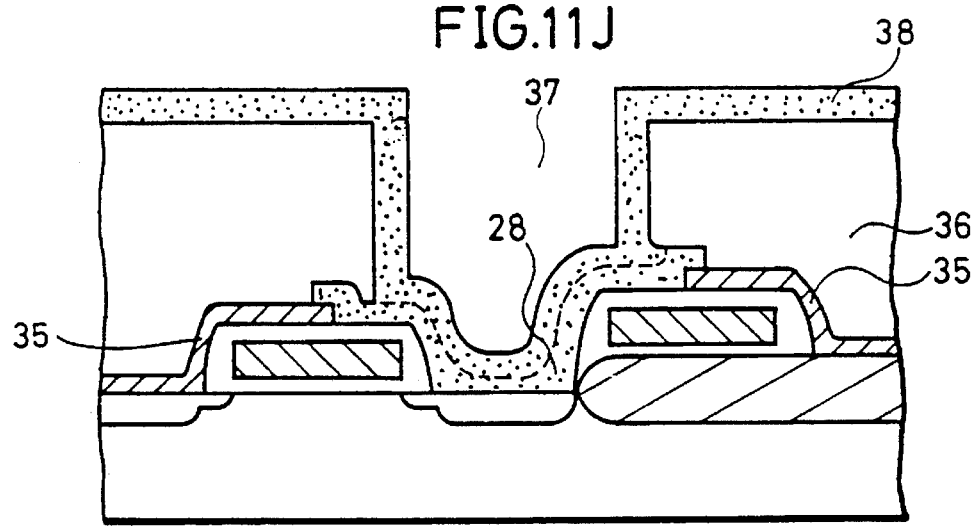

Further, in FIG. 11J, an insulating film 36 is thickly deposited on the top surface of the lower electrode 28 or the nitride film 35 by the CVD method. The thickness of the insulating film 36 defines the height of a rising wall portion 28a of the lower electrode 28 formed in the succeeding steps. An opening portion 37 is then formed in a prescribed position of the insulating film 36. In addition, a polycrystalline silicon layer 38 is deposited on the surface of the insulating film 36 and in the opening portion 37 by the low pressure CVD method.

Figure 11K:
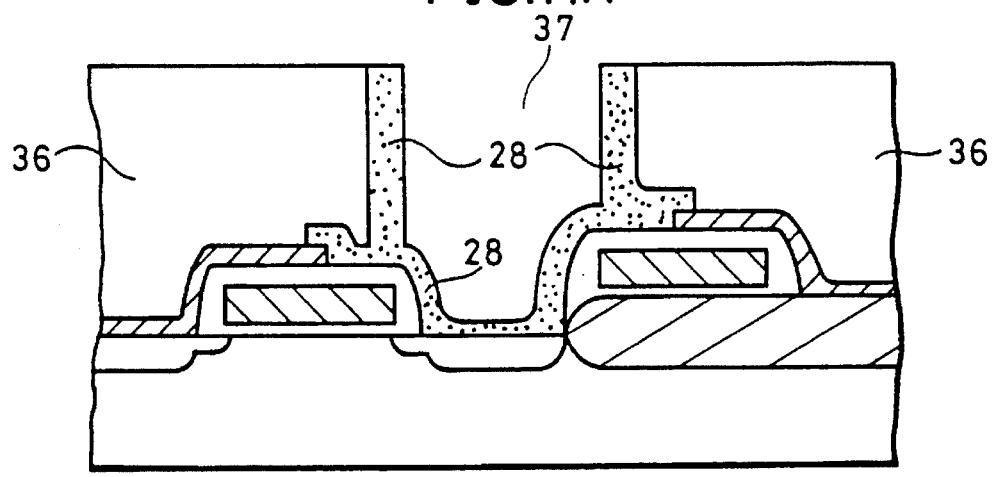

Referring to FIG. 11K, the polycrystalline silicon layer 38 is selectively removed by anisotropical etching. Accordingly, the polycrystalline silicon layer 38 deposited on the plane surface of the insulating film 36 and on the top surface of the lower electrode 28 is selectively removed, and the polycrystalline silicon layer 38 deposited on the internal side surface of the opening portion 37 of the insulating film 36 remains selectively. According to this etching step, the rising wall portion 28a of the lower electrode integral to the lower electrode 28 is formed.

Figure 11L:
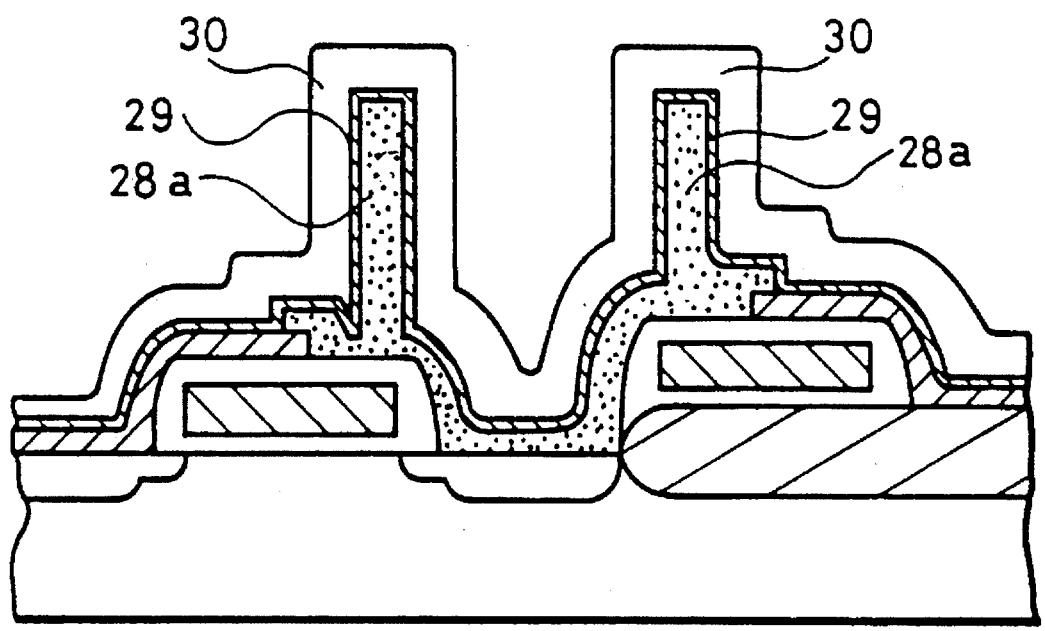

Further, in FIG. 11L, after the insulating film 36 is removed, a nitride film is entirely deposited by employing the low pressure CVD method. Thereafter, the semiconductor substrate 1 is thermally processed in an oxygen atmosphere to oxidize a portion of the deposited nitride film, so that a dielectric film 29 made of a composite film of a nitride film and an oxide film is formed. This dielectric film 29 is formed to completely cover the surfaces of the lower electrodes 28, 28a. A polycrystalline silicon layer 39 is then deposited by employing the low pressure CVD method. Thereafter, the polycrystalline silicon layer 39 and the dielectric film 29 are patterned in a prescribed shape. Further, an interlayer insulating film 40 such as an oxide film is thickly deposited on the entire surface by the CVD method. A contact hole 41 is formed in the interlayer insulating film 40. A tungsten film 43 is selectively formed in the contact hole 41 by the CVD method. In addition, a tungsten silicide film 44 and the like are applied onto the surface of the tungsten film 43 and the surface of the interlayer insulating film 40 by employing a sputtering method to be patterned in a prescribed shape. A bit line 42 is formed according to this step. The memory cell of the DRAM is manufactured according to the foregoing steps.

For an interconnection layer such as the bit line 42 in the above described embodiment, a polycrystalline silicon layer film, a metal silicide film, a metal film, a TiN (titanium nitride) film or a composite film thereof may be used, for example.

Figure 12:
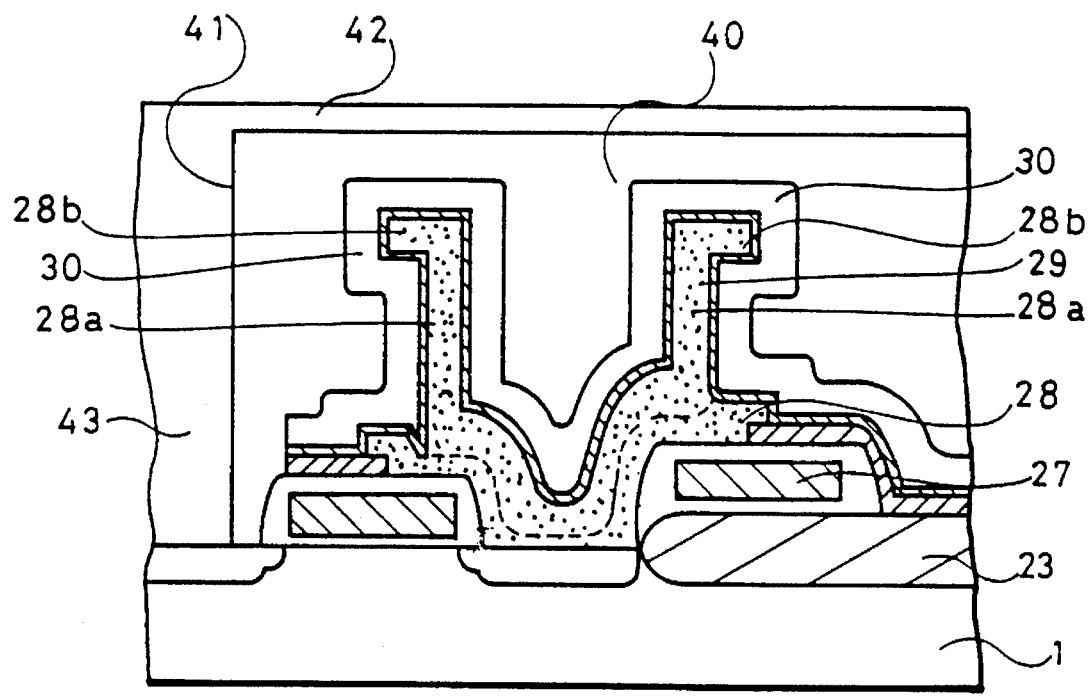
FIG. 12 is a cross sectional view of the memory cell of the DRAM illustrating the eighth embodiment of the present invention.

FIG. 12 is a cross sectional view of the memory cell of the DRAM illustrating the eighth embodiment of the present invention. This embodiment differs from the above described seventh embodiment in that a projecting portion 28b is formed extending further in a horizontal direction on the rising wall portion 28a of the low electrode 28. The external surface of the lower electrode 28 is further increased by this projecting portion 28b. Therefore, an area facing in the dielectric film 29 formed to contact therewith is also increased.

Figure 13:
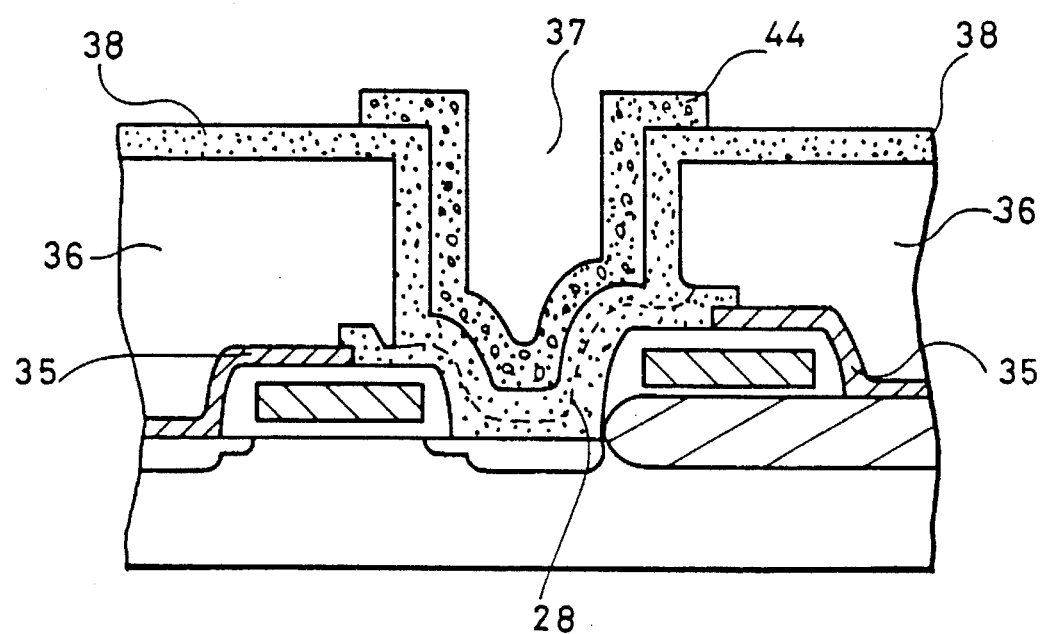
FIG. 13 is a cross sectional view illustrating major manufacturing steps of the memory cell shown in FIG. 12.

FIG. 13 is a cross sectional view illustrating a main part of the manufacturing steps of the lower electrode 28 in the memory cell of the DRAM shown in FIG. 12 and corresponds to the steps of FIGS. 11J and 11K in the above described seventh embodiment. That is, the polycrystalline silicon layer 38 is formed on the internal surface of the opening portions 37 formed in the insulating film 36 and on the surface of the insulating film 36. A resist pattern 44 of a prescribed shape is then formed on the surface of the polycrystalline silicon layer 38. Further, the polycrystalline silicon layer 38 is selectively removed using the resist pattern 44 as a mask. The projecting portion 28b of the lower electrode 28 is formed according to this photolithography step and the etching step.

Figure 14:
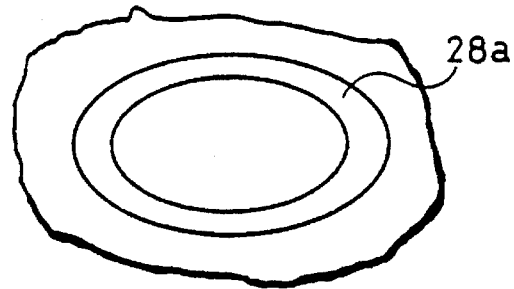
FIG. 14 is a typical view illustrating an example of a variation of a plane-shaped lower electrode of a capacitor in the memory cell according to the seventh and eighth embodiments.

FIG. 14 illustrates an example of a variation of the plane-shaped rising wall portion 28a of the capacitor of the semiconductor device shown in FIGS. 8–10 and 12. That is, the plane shape of the rising wall portion 28a of the capacitor described above is, for example, rectangular as shown in a plan view of FIG. 8. However, the rising wall portion 28a of the lower electrode of the capacitor may be elliptic as shown in FIG. 14, for example, and also be circular.

Figure 15:
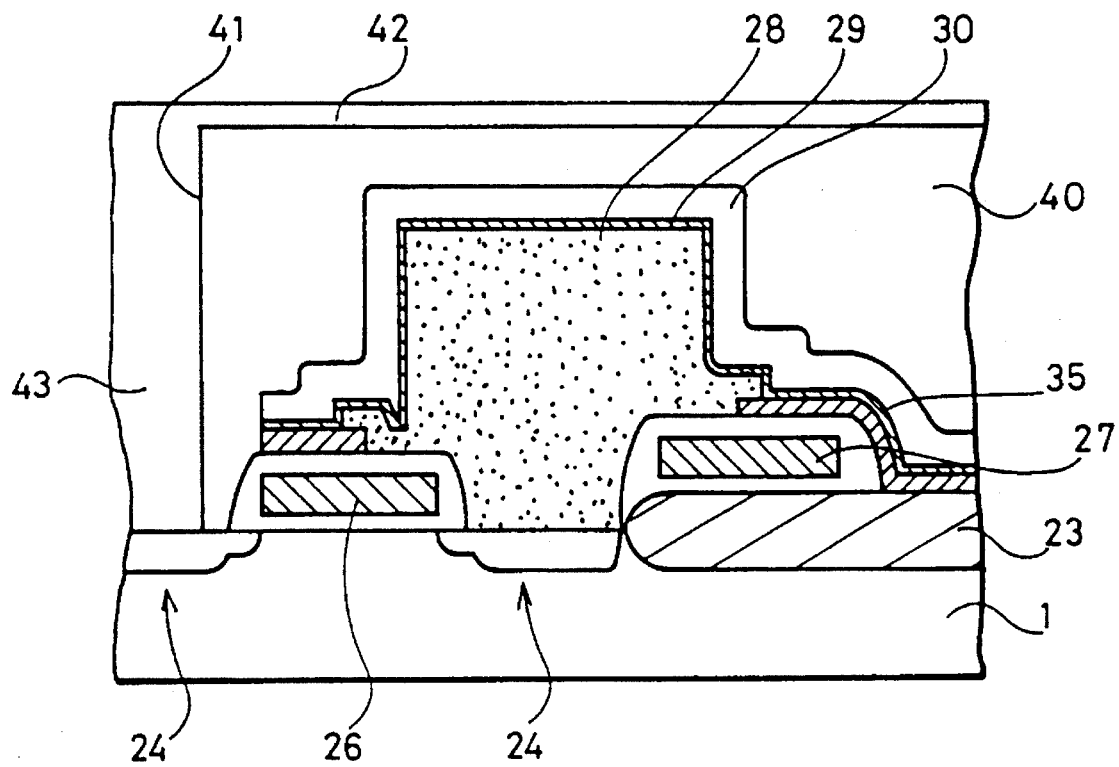
FIG. 15 is a cross sectional view of the memory cell illustrating another example of a variation of the low electrode of the capacitor as well as in FIG. 14.
Figure 16:
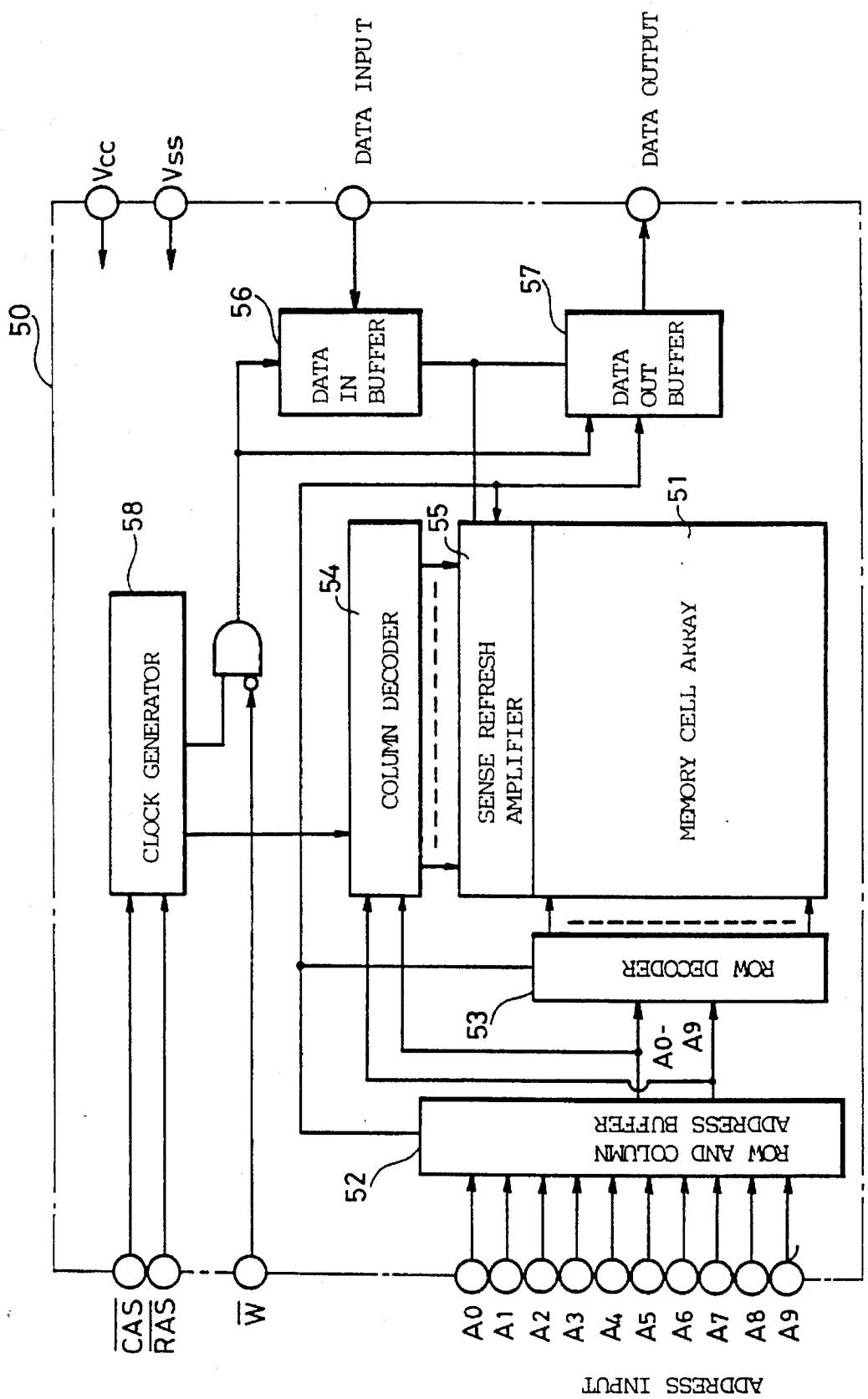
FIG. 16 is a block diagram illustrating a common DRAM structure.
Figure 17:
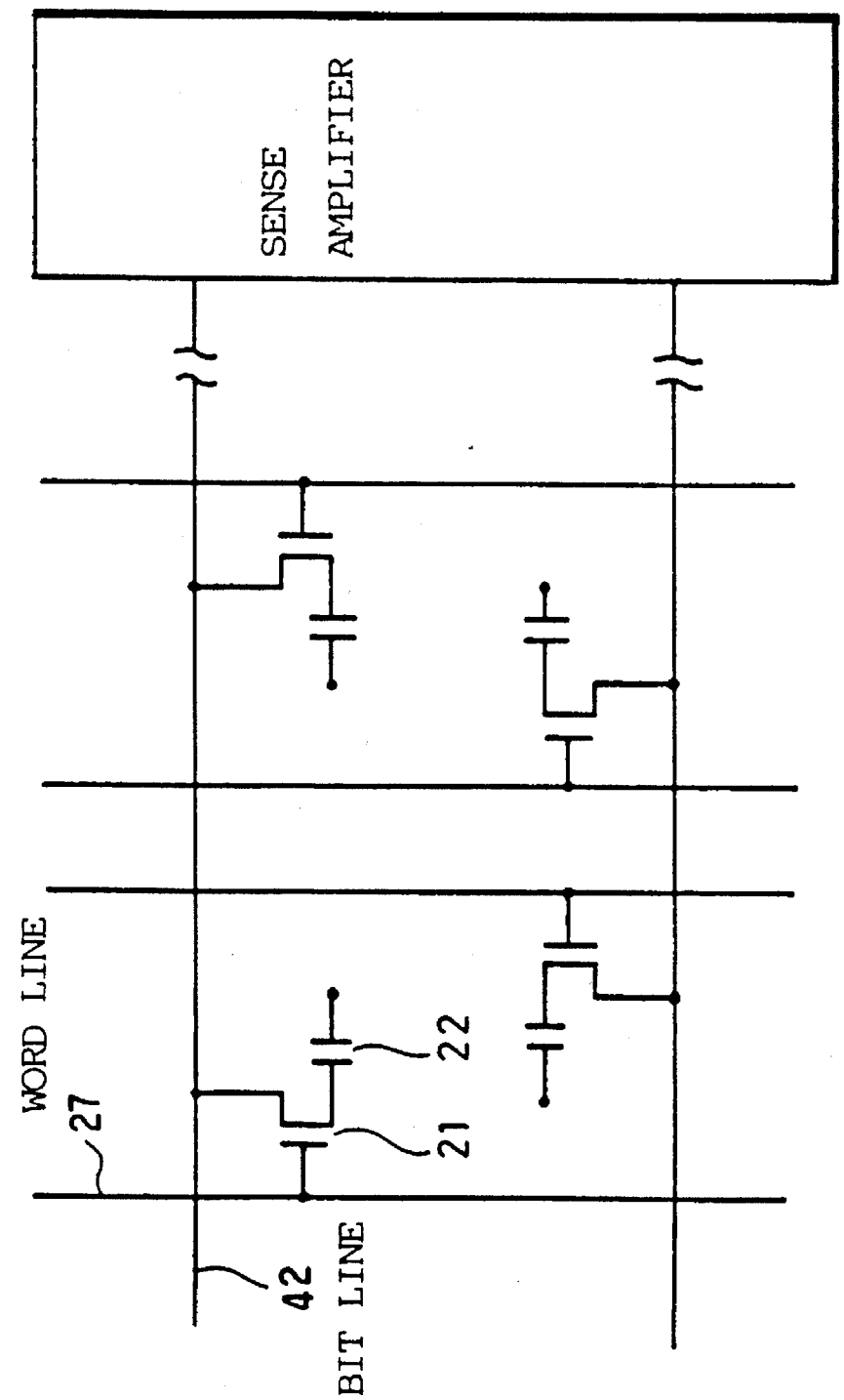
FIG. 17 is an equivalent circuit diagram of a memory cell array of the DRAM shown in FIG. 16.
Figure 18:
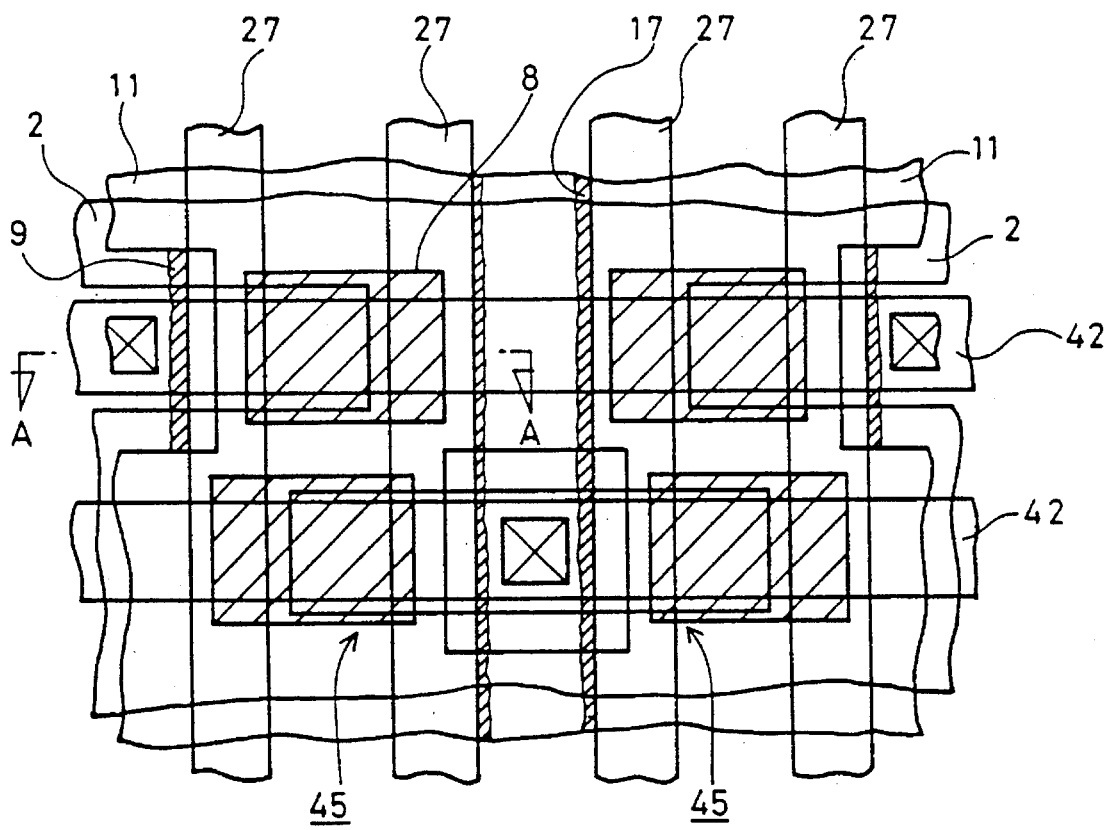
FIG. 18 is a plan view of the memory cell of a conventional DRAM.
Figure 19:
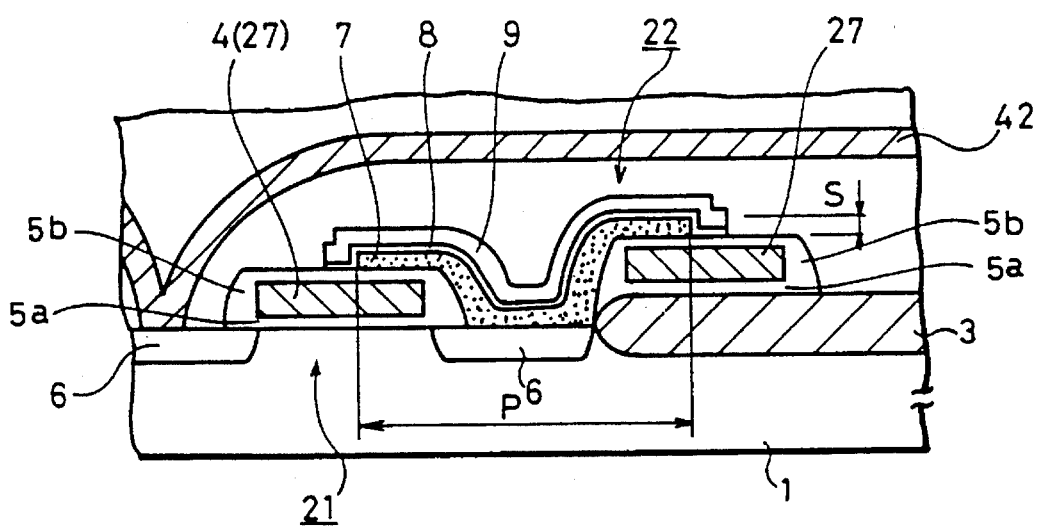
FIG. 19 is a cross sectional view of the memory cell shown in FIG. 18.
Figure 20A:
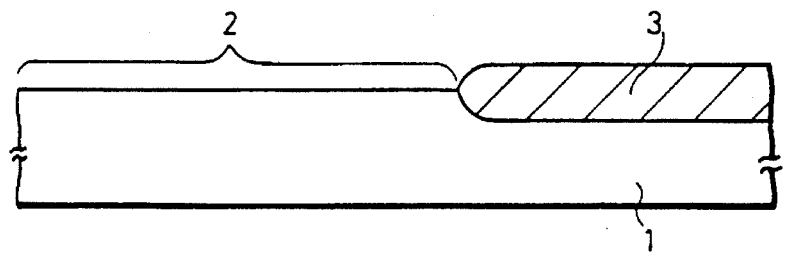
FIGS. 20A–20D are cross sectional views illustrating the manufacturing steps of the memory cell of the conventional DRAM.
Figure 20B:
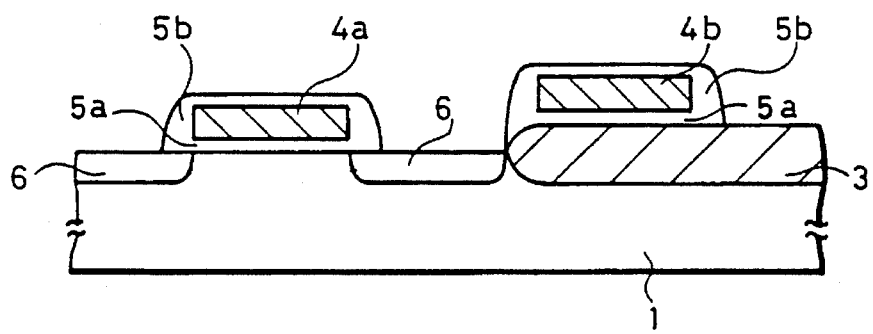
Figure 20C:
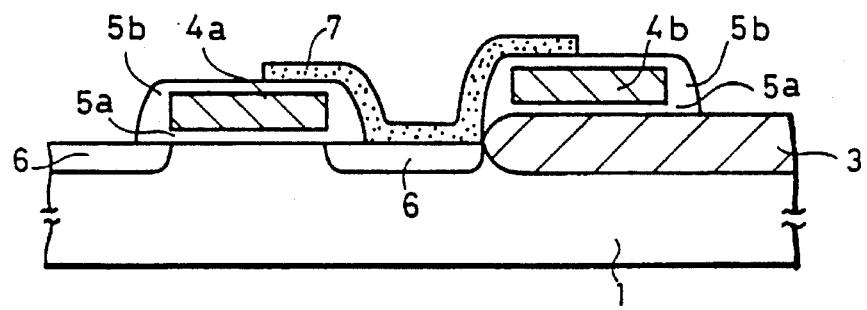
Figure 20D:
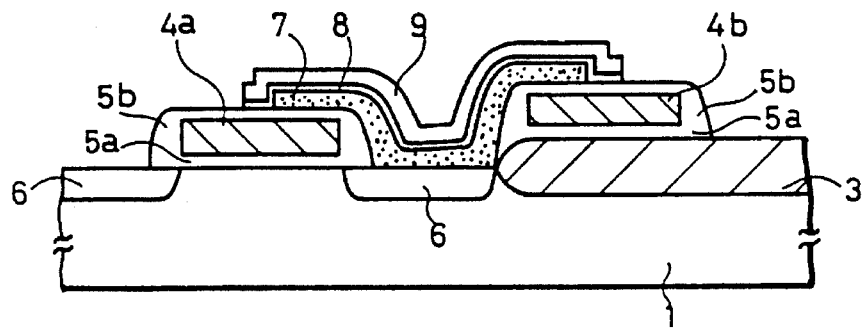
Figure 21:
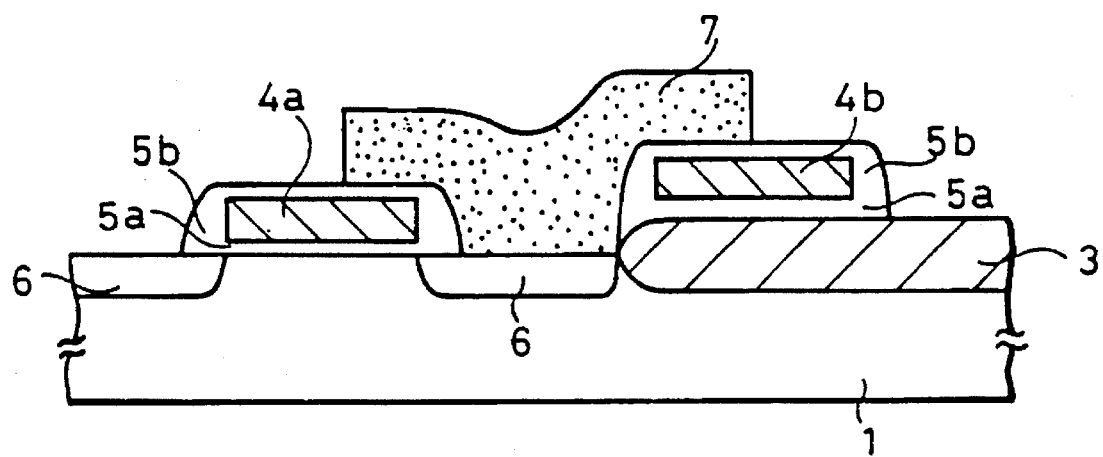
FIG. 21 is a cross sectional view illustrating the manufacturing steps of forming a conductive layer 7 of the memory cell of the conventional DRAM.

Further, FIG. 15 is a cross sectional view illustrating the case that the rising wall portion 28a of the lower electrode 28 in the capacitor of the DRAM is not a hollow but solid cylindrical shape. Such a shape is effective when an element structure of the memory cell is miniaturized. Furthermore, the plane shape of this rising wall portion 28a may be a cuboid or ellipse not limited to a cylinder.

As described heretofore, in the present invention, by providing step portions, rising portions or the like on the both end portions of the lower electrodes 7, 28 of the capacitor, the surface areas thereof are intended to be increased, and also an increase in the plane area occupied therein is suppressed. Accordingly, the area increases where the lower electrodes and the dielectric film face each other, so that the charge storing capacitance of the capacitor can be increased.

As has been described heretofore, according to the present invention, a first conductive film has on a first insulating film, at least either portions apart from the first insulating film or steps on the surface thereof. Accordingly, the surface area of the first conductive film increases. Therefore, the semiconductor device having fewer short circuits and an increased capacity without making the conductive film thick, and the manufacturing method thereof can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A capacitor of a semiconductor memory device, comprising:
    a semiconductor substrate having a conductive region on a major surface thereof,
    an insulating layer formed on the major surface of said semiconductor substrate, a gate electrode being formed above said major surface of said semiconductor substrate through a portion of said insulating layer,
    a first electrode layer formed extending on a major surface of said insulating layer and on said conductive region,
    a dielectric layer covering a surface of said first electrode layer, and
    a second electrode layer formed on a surface of said dielectric layer,
    wherein, viewed in vertical cross-section, said first electrode layer comprises two projections of uniform thickness throughout elongated in a direction substantially normal to said major surface of said substrate, at least one said projection being located above and overlapping a portion of said gate electrode, said projections having inner walls facing each other on opposite sides of a central region and further having outer walls,
    and further wherein said dielectric layer and said second electrode layer are formed continuously on said inner walls and outer walls to enclose said projections.

2. A capacitor of a semiconductor memory device in accordance with claim 1, wherein upper ends of said first electrode layer lie in a common plane parallel to said substrate.

3. A memory cell of a semiconductor memory device having one transistor and one storage means, comprising:
    a semiconductor substrate having a flat major surface;
    a pair of source/drain regions of said transistor formed in the major surface of said semiconductor substrate;
    a gate electrode of said transistor formed between said pair of source/drain regions in the major surface of said semiconductor substrate, with a gate insulator therebetween;
    one electrode of said storage means having a first portion electrically connected to the one source/drain region of said transistor, a second portion electrically insulated from said gate electrode and formed to be extending continuously from said first portion over said gate electrode, a third portion formed to be extending continuously from said second portion onto an isolation region formed in the major surface of said semiconductor substrate for isolating between memory cells, a fourth portion formed to be continuously projecting upward from said second portion, overlapping said gate electrode, and having a pair of substantially parallel side surfaces and a top surface, and a fifth portion formed to be continuously projecting upwardly from, and overlapping, said third portion and having a pair of substantially parallel side surfaces and a top surface, inner side surfaces of said fourth and fifth portions facing each other; and the other electrode of said storage means formed to be opposing to said one electrode with a dielectric layer therebetween and formed continuously on (1) a surface of said first portion, (2) a surface of said second portion, (3) a surface of said third portion, (4) the pair of side surfaces and the top surface of said fourth portion and the pair of side surfaces and the top surface of said fifth portion included in said one electrode of said storage means.

4. The memory cell according to claim 3, wherein:

said second and third portions of said storage means are continuously formed to surround said first portion, and said fourth and fifth portions are also continuously formed to surround said first portion.

5. The device of claim 4, wherein a gate electrode of said memory device is formed above the major surface of said substrate through a portion of said insulating layer, and wherein at least part of said projecting portions of said first electrode layer is formed above and overlapping said gate electrode.

* * * * *